United States Patent [19]

Blum et al.

[11] Patent Number: 5,418,484
[45] Date of Patent: May 23, 1995

[54] LINE FAULT DETECTION SYSTEM WITH A DIFFERENTIAL DRIVER

[75] Inventors: David W. Blum, Essex Junction; John E. Gersbach, Burlington, both of Vt.

[73] Assignee: International Business Machines Corp., Armonk, N.Y.

[21] Appl. No.: 87,825

[22] Filed: Jul. 1, 1993

[51] Int. Cl.[6] .................. H03K 3/00; H03K 17/56; H03K 17/60
[52] U.S. Cl. .................. 327/108; 327/423; 327/432
[58] Field of Search .............. 307/270, 570, 253, 254, 307/255; 324/525, 526, 549; 327/423, 494, 495, 496, 497, 508, 587, 588, 433, 432, 478, 482, 484, 108

[56] References Cited

U.S. PATENT DOCUMENTS

| | | | |
|---|---|---|---|
| 3,828,206 | 8/1974 | Zuk | 307/270 |
| 4,697,099 | 9/1987 | Bonaccio | 307/355 |
| 4,916,338 | 4/1990 | Metz | 307/570 |
| 5,142,245 | 8/1992 | Barbu | 307/254 |
| 5,285,121 | 2/1994 | Sugawara | 307/270 |

*Primary Examiner*—Timothy P. Callahan
*Assistant Examiner*—Toan Tran
*Attorney, Agent, or Firm*—Thornton & Thornton

[57] ABSTRACT

This is a detector system comprised of a differential driver circuit, a driver output stage and splitter circuit and a multiplexor. The driver circuit employs a bridge circuit that converts input logic voltages to lower voltage differential outputs by utilizing a pair of current switch transistors coupled to the bridge circuit. The bridge circuit is comprised of cross coupled transistors whose inputs are coupled to matched true and complement input logic voltages that swing between zero volts and the power supply voltage. The bridge transistors convert the differential logic input voltage swings to smaller values that are compatible with driving the splitter and multiplexor circuits coupled thereto. The driver circuit and the splitter circuit share the driver output transistors which are arranged in parallel pairs. These pairs are coupled to respective output lines whose physical state is to be determined and to the multiplexor which is an emitter coupled switch coupled to emitter follower transistors which are, in turn, connected to respective output lines so that the output voltage of the output transistors can be used to determine if the output lines are open.

8 Claims, 3 Drawing Sheets

LINE FAULT DETECTION SYSTEM WITH A DIFFERENTIAL DRIVER

FIELD OF THE INVENTION

This invention relates to a line fault detection system and more particularly to a line fault detection system using a differential driver circuit.

DESCRIPTION OF THE PRIOR ART

Circuits for driving differential line pairs from complementary MOS transistors or transistor/transistor logic systems have had large common mode signal components that tend to be converted to a different mode. Differential line drivers used with systems for detecting line faults have traditionally comprised analog circuits or single-ended switching circuits so that the system can only detect open circuits. Such systems are not only noise sensitive, but also are sensitive to absolute tolerances resulting in false alarms. A typical example of one such differential open cable detection system is taught in IBM Technical Disclosure Bulletin, Vol. 33, No. 2, July 1990, pages 121-124, in an article entitled, "Differential Open Cable Detection Circuit". The circuit shown in this reference utilizes a pair of emitter coupled circuits driven by complementary inputs with their outputs coupled to an open cable detection circuit which needs accurate analog voltage detection circuit in a closely controlled reference voltage.

Other patents, such as U.S. Pat. No. 4,621,238; 4,264,832; 4,286,179 and 4,743,781 all assigned to the same assignee as the present invention, teach a standard so-called H-driver configuration having various features, such as gain control and logical functions but none teach a balanced FET circuit driving a bipolar output stage which is a principal feature of the present invention.

Other patents such as U.S. Pat. No. 4,697,099 also issued to the same assignee as the present invention teach an open circuit detector for differential lines, however, this circuit is essentially independent of the driver circuit and depends on very close tolerances to accomplish its function.

The present invention is essentially different from all the known cited prior art in that it provides a detection circuit integrated into the driver in a logical way that provides both open circuit and short circuit detection. The present invention is not only precise but does not require tight tolerances except for tracking which is inherent in integrated circuits. The present invention also avoids the need for reference voltages as required in the prior art.

SUMMARY OF THE PRESENT INVENTION

The object of the present invention is to provide an open circuit detector system for differential lines which is not only independent of the driver circuit but requires no reference voltage while it provides precise short circuit detection.

The present invention accomplishes this by using a balanced FET circuit driving a bipolar output stage.

The detector system is comprised of a differential driver circuit, a driver output stage, a splitter circuit and a multiplexor. The splitter circuit and the driver circuit share the driver output transistors which are arranged in parallel pairs. These pairs are coupled to respective output lines whose physical state is to be determined. The multiplexor is an emitter coupled switch coupled to the emitter follower transistors which are connected to respective output lines so that the output voltage of the output transistors can be used to determine if the output lines are open.

It is thus a further object of the invention to provide an improved differential driver with line fault detection which utilizes a balanced FET bridge circuit and a bipolar output stage.

These principal objects of the invention are accomplished in a bridge circuit coupled to the detector circuit. The bridge circuit converts input logic voltages to lower voltage differential outputs. This is done by utilizing a pair of current switch transistors coupled to the bridge circuit which is comprised of cross coupled N-type Field Effect Transistors (FETs) whose inputs are coupled to matched true and complement CMOS input logic voltages that swing between zero volts and the power supply voltage. The bridge FETs convert the differential logic input voltage swings to smaller values that are compatible with driving the splitter and multiplexor circuits coupled thereto.

These and other objects, features and advantages of the invention will be apparent from the following more particular description of the preferred embodiment of the invention as illustrated in the accompanying drawings.

DESCRIPTION OF THE PREFERRED EMBODIMENT

Figure 1:
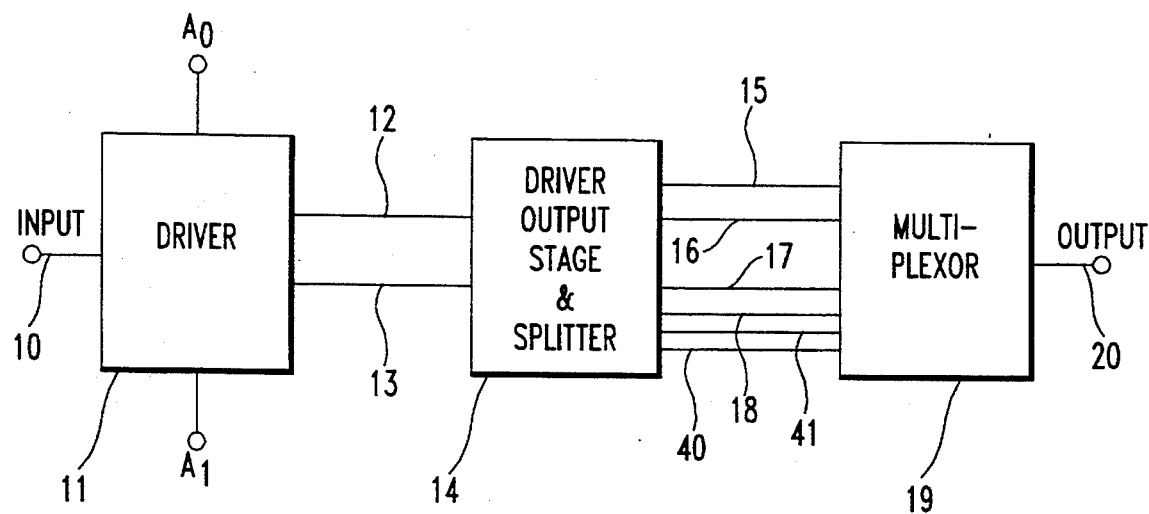
FIG. 1 is a block diagram of the line driver and line fault detection system.

There is shown in FIG. 1, a block diagram a line fault detection system contemplated by the present invention. In this figure an input 10 is applied to a differential driver circuit 11 which has differential inputs A0 and A1 also applied thereto. The driver outputs 12 and 13 of the driver circuit 11 are coupled to a driver output stage and splitter circuit 14 which is coupled via six output signal lines 15, 16, 17, 18, 40 and 41 to a multiplexor 19 which determines the state of an output line capacitor and couples it to a system output line 20.

Figure 2:
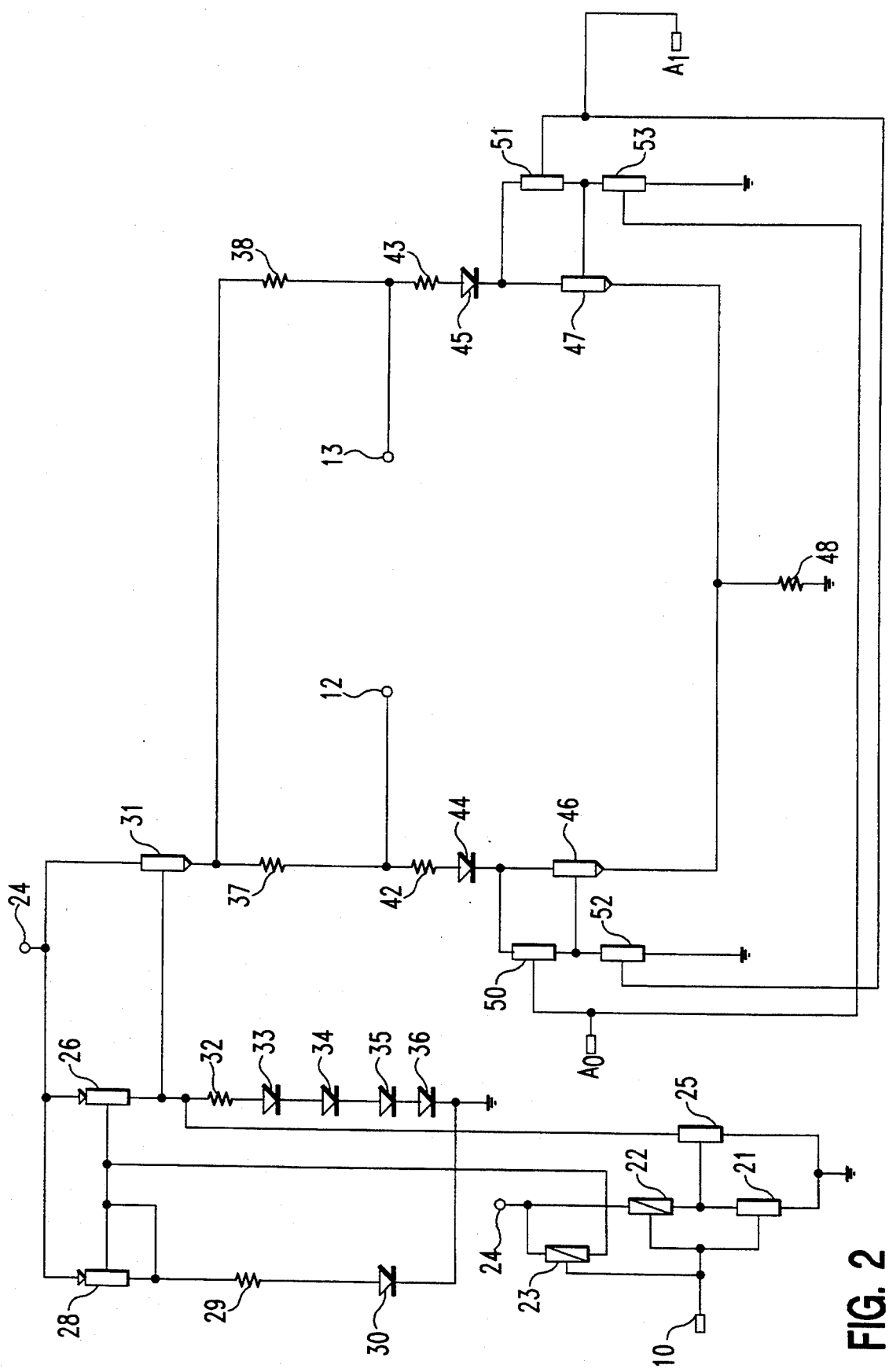
FIG. 2 is a schematic presentation of the driver portion of the system.

Turning now to FIG. 2, the driver circuit 11 will be described in more detail. The input 10 is coupled to the gates of a pair of complementary field effect transistors (FET) 21 and 22 and to a P-type FET transistor 23. The sources of transistors 22 and 23 are coupled to a voltage source 24. The drain of transistor 23 is coupled to the bases of PNP bipolar transistors 26 and 28. The drain of transistor 22 is coupled to the gate of an N-type FET 25 and through transistor 21 to ground. The source of transistor 25 is also coupled to ground while its drain is coupled to the voltage source 24 through transistor 26, whose emitter is coupled to the voltage source 24. The collector of transistor 28 is coupled to its base and the base of transistor 26, and through resistor 29 and a diode 30 to ground. The collector of transistor 26 is coupled to the drain of transistor 25, the base of transistor 31 and through a resistor 32 and a series of diodes 33, 34, 35, and 36, i.e. a diode chain, to ground. The emitter of transistor 31 is connected through parallel resistors 37 and 38 to driver output lines 12 and 13, then through resistors 42 and 43 and diodes 44 and 45 respectively and through respective NPN bipolar transistors 46 and 47 and common resistor 48 to ground, and also through the bridge circuit, comprising series transistors 50 and 52 and series transistors 51 and 53, to ground. The gates of transistors 50 and 53 are each connected to differential input A0 and the gates of transistors 51 and 52 are each coupled to differential input A1. The outputs 12 and 13 are coupled to the driver output stage and splitter circuit 14 shown, in detail, in FIG. 3.

Figure 3:
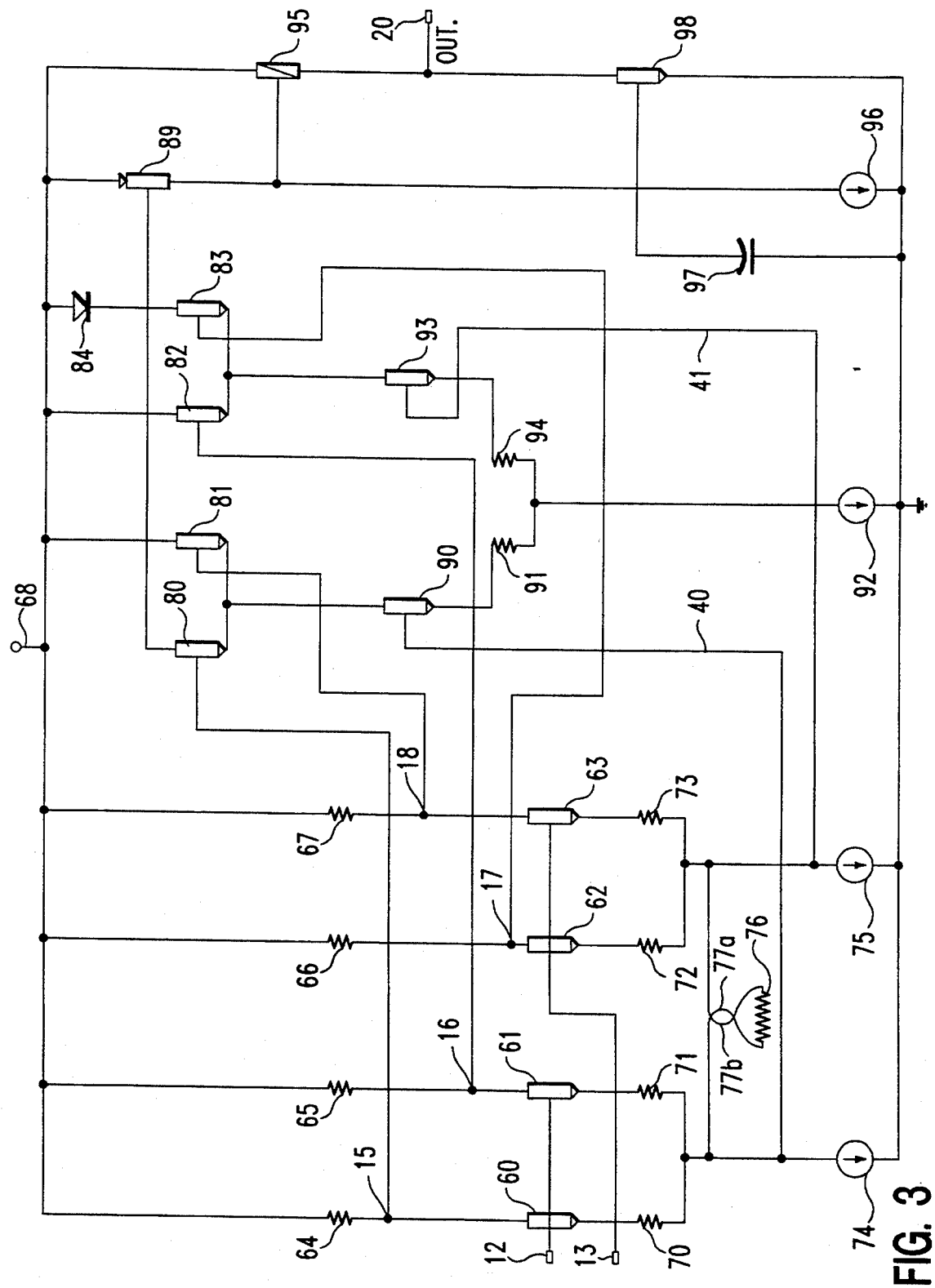
FIG. 3 is a schematic diagram of the driver output stage, the splitter circuit, and the multiplexor circuit portions of the system.

As shown in FIG. 3, the driver output line 12 of the driver circuit is connected to the bases of matched NPN bipolar output stage and splitter transistors 60 and 61 while the driver output line 13 is coupled to the bases of matched NPN bipolar output stage and splitter transistors 62 and 63. These splitter transistors 60, 61, 62, and 63 serve not only as the output stage transistors of the driver circuit but also as the input transistors of the splitter circuit. The collectors of these splitter transistors are coupled through respective resistors 64, 65, 66 and 67 to a voltage source 68, while the emitters of the transistors 60, 61, 62, and 63 are coupled through respective matched resistors 70, 71, 72 and 73 to respective current sources 74 and 75 and output lines 40 and 41. Resistors 70 and 71 are coupled together, to driver output line 40, and to the current source 74 while resistors 72 and 73 are coupled together, to the driver output line 41, and to the current source 75. The driver output lines 40 and 41 are respectively coupled through termination lines 77a and 77b to termination resistor 76.

The collector of transistor 60 is further coupled to output signal line 15 and thence to the base of NPN bipolar follower transistor 80 of a first emitter coupled pair of transistors in the multiplexor circuit 19 while the collector of transistor 61 is coupled to output signal line 16 and thence to the base of NPN bipolar follower transistor 82 of a second emitter coupled pair of transistors in the multiplexor circuit 19. The collector of transistor 63 is coupled to signal output line 18 and thence to the base of NPN bipolar follower transistor 81 which is the other transistor of the above discussed first emitter coupled pair. Transistor 62 has its collector coupled to the output line 17 thence to the base of NPN bipolar transistor follower 83 which is the other transistor of the above discussed second emitter coupled pair. The collector of transistor 80 is coupled to the base of transistor 89 and to the collector of transistor 83 and from there through the cathode of a diode 84 to voltage source 68. The collectors of transistors 81 and 82 are coupled to the voltage source 68. The emitters of the first emitter coupled pair of transistors 80 and 81 are coupled together and through an NPN bipolar transistor 90 and a resistor 91 to a current source 92 which is coupled to ground. Similarly, the emitters of transistors 82 and 83 comprising the second coupled pair are coupled together and through an NPN bipolar transistor 93 and a resistor 94 to the same current source 92. The base of transistor 90 is coupled to both line 40 and one side of termination resistor 76 via line 77a while the base of transistor 93 is coupled to line 41 and the other side of the termination resistor 76 via line 77b. The collector of transistor 89 is coupled to the gate of a P-type FET pull-up transistor 95 and through still another current source 96 to ground, to a capacitor 97 connected in parallel with current source 96 and to the gate of an N-type FET pull-down transistor 98. The drain of transistor 98 and the drain of transistor 95 are both coupled to the system output line 20.

As shown in the FIGS. 1-3, inputs A0 and A1 are time matched true and complement CMOS logic levels that swing between zero volts and the power supply voltage 24 which is, for example, 5 volts. These matched true and complement CMOS logic level signals drive the gates of the bridge transistors 50, 51, 52 and 53 which serve to drive current switch transistors 46 and 47 and thus convert the input logic level voltage swings to smaller values that are compatible with driving the output current lines 12 and 13.

As noted previously, these signal lines 12 and 13 in turn drive splitter transistors 60, 61, 62, and 63 which are in turn coupled to the termination resistor 76. Parallel resistors 70 and 71 and 72 and 73 terminate the driver and the differential line pair 77 while resistor 76 terminates the receiving end. The driven end may be terminated in a value higher than the characteristic impedance of the line to reduce power dissipation. Thus, no single-ended termination at the far end of the line occurs. Since the driver is designed to transmit a very small single-ended signal component the line is terminated at the near end in both differential and single ended modes.

The driver circuit of FIG. 2 is particularly designed to provide a current drive from the current switch transistors 46 and 47 to result in a significantly lower power than is achieved by other type drivers. The present driver circuit also serves to reduce common mode signal components that are easily passed through the driver circuits of the prior art.

The operation of the open line detection circuit in FIG. 3, is fully described below. The outputs of the driver output lines 12 and 13 of FIG. 2 is each split into two separate and unequal voltages, one at the collectors of splitter transistors 60 and 61, and the other at the collectors of splitter transistors 62 and 63. The signals at the collectors of transistors 60 and 61 are complementary to those at the collectors of transistors 62 and 63. Thus, these transistors and their associated resistors 64-73 and the current sources 74 and 75 function to split the signals. Since the differential line 77a and 77b being measured is terminated by a low value resistor 76 nearly all the current in the two output current sources 74 and 75 will flow in either transistor pair 60 and 61 or 62 and 63 depending upon the polarity of the data being driven to the signal output lines 12 and 13.

If either one or both of the lines 77a and 77b are open, the output currents flow equally in transistor pair 60 and 61 and in pair 62 and 63 to permit a suitable differential voltage to exist across the differential lines 77a and 77b. The values of resistors 64 and 66 are chosen to be half the value of the resistors 65 and 67, thus causing a differential voltage to exist between the lines 15 and 16 and 17 and 18 in the presence of equal currents through the transistor pair 60 and 61 and pair 62 and 63 when one or both of the lines are open. Thus, a differential voltage is assured to take on an opposite polarity depending upon whether the lines 77a and 77b are open or connected and to provide a binary indication of the actual state of the lines under any condition.

Transistors 80-93 form the heart of multiplexor circuit 19 which selects either nodes 15 and 18 or nodes 16 and 17 depending upon the state of the output data. This causes the output current in current source 92 to be routed to the power supply when the line is normally connected and the diode 84 when the line is open. The current in diode 84 is mirrored in transistor 89 and is substantially larger than that supplied by the current source 96 so that a large voltage swing is produced at capacitor 97. If the differential output lines 77a and 77b are shorted the differential output voltage signal is smaller and results in incomplete switching of the current in current source 92 and switching between transistors 90 and 93 is incomplete or indeterminate. Any current that does flow in the normally off side of transistors 90 and 93 is routed to the diode 84 and an error signal is produced as in the open line case. The resistors 91 and 94 are of low value to degenerate the gain of transistors 90 and 93, the values chosen in conjunction with current source 96 to set the trip level for shorted line detection. In this case about one quarter of the current flowing through current source 92 is switched into diode 84 and is mirrored in transistor 89 so that the current through current source 92 is approximately four times that of the current through current source 96. The capacitor 97 coupled across the current source 96 integrates any transient currents that may occur during data switching and prevents false fault indications. A complementary pair of CMOS transistors 95 and 98 combine to create a standard CMOS logic inverter to drive the output error signal. The arrangement shown here typically provides signals twice that of any single-ended arrangement with a reference voltage. Thus, this results in approximately three times the noise immunity of prior art arrangements and can be a very important parameter for fault detection circuits to prevent a false signal indicating a fault which, in fact, does not exist.

Other alterations and modifications of the present invention will now become apparent to those skilled in the art without departing from the spirit and scope of the invention as set forth in the following claims.

What is claimed is:

1. A driver circuit for converting first and second differential CMOS logic level input voltages to lower differential output voltages comprising;
   a current switch, including first and second emitter coupled, bipolar current switch transistors, each having a collector, a base and an emitter, providing differential voltage outputs at the collectors of the current switch transistors and a current drive at the emitter of said current switch transistors;
   means coupled to and controlling said current switch;
   said means comprising a bridge circuit comprised of:
      first and second pairs of serially arranged field effect transistors, each of said pairs being coupled between the output of a respective one of said bipolar transistors of said current switch and ground;
      a first transistor of said first pair being coupled to said first differential CMOS logic level voltage input;
      a second transistor of said first pair being coupled to said second differential CMOS logic level voltage input;
      a first transistor of said second pair being coupled to said second differential CMOS logic level voltage input;
      a second transistor of said second pair being coupled to said first differential CMOS logic level voltage input.

2. The driver circuit of claim 1 wherein said driver circuit further includes a signal input coupled to a pair of complementary field effect transistors having a common connection, and to a P-type, field effect transistor;
   the source of the P-type transistor being coupled to a voltage source and its drain being coupled to the bases of third and fourth PNP bipolar transistors;
   the common connection of the complementary transistors driving an N-type field effect transistor whose drain drives a current drive transistor coupled to and supplying current to said current switch.

3. A detector system for determining the state of a resistively terminated two sided line comprising:
   a driver circuit being coupled through a driver output stage and splitter circuit to a multiplexor,
   said driver output stage and splitter circuit comprising a plurality of bipolar transistors arranged in parallel pairs,
   the transistors of each said pair having their emitters commonly coupled to a respective current source and to a respective side of said resistively terminated line whose electrical physical state is to be determined and their collectors coupled to the driver output stage and splitter circuit output lines coupled to said multiplexor.

4. The system of claim 3 wherein:
   said multiplexor comprises a current switch formed of a plurality of transistors, each transistor of the current switch having its input coupled to a respective one of said current sources and a respective one side of said resistively terminated line and its collector coupled to the emitters of respective follower transistors;
   each follower transistor having its base coupled to a respective one of said output lines for comparing the output voltage of said output transistors to determine if one or both of said resistively terminated lines are open.

5. The detector system of claim 3 wherein:
   said multiplexor comprises an emitter coupled current switch formed of a plurality of transistors, each transistor of the current switch having its base coupled to a respective one of said current sources and a respective one side of said resistively terminated line and its collector coupled to the emitters of respective follower transistors;
   each follower transistor having its base coupled to a respective one of said output lines for comparing the output voltage of said output transistors to determine if one or both of said resistively terminated lines are open.

6. An open circuit detector system for resistively loaded differential lines requiring no reference voltage while providing precise short circuit detection of the differential lines comprising:
   a driver circuit, a driver output stage and splitter circuit, and a multiplexor,
   said driver circuit comprising;
      a balanced transistorized bridge circuit driving a current switch for converting first and second differential CMOS logic level input signals to lower voltage differential outputs to said driver output stage and splitter circuit to said multiplexor,
   said current switch comprising a pair of current switch transistors and a current drive transistor, for providing a current drive output and a voltage drive;
   said bridge circuit comprising first and second pairs of serially arranged transistors, each of said pairs coupled to a respective one of said transistors of said current switch;

a first transistor of said first pair being coupled to said first differential CMOS logic level voltage input;

a second transistor of said first pair being coupled to said second differential CMOS logic level voltage input;

a first transistor of said second pair being coupled to said second differential CMOS logic level voltage input;

a second transistor of said second pair being coupled to said first differential CMOS logic level voltage input;

said driver output stage and splitter circuit comprising;

a plurality of transistors having first, second, and third terminals arranged in parallel pairs;

the transistors of each said pair having a first terminal commonly coupled to a respective current source, and to a respective one of said resistively loaded differential lines whose electrical physical state is to be determined and a second terminal coupled to the respective output lines coupled to said multiplexor;

said multiplexor comprising;

a current switch composed of parallel transistors having first, second, and third terminals, each of said parallel transistors having said first terminal coupled to a common current source, said second terminal coupled to a respective one of said resistively loaded differential lines and said third terminal coupled to a respective follower transistor;

each follower transistor further being coupled to a respective one of said output lines for comparing the output voltage of said output transistors to determine if one or both of said resistively loaded differential line are open.

7. The open circuit detector system of claim 6 wherein:

in said driver output stage and splitter circuit the transistors of each said parallel pair have emitter, base, and collector terminals and have their emitters commonly coupled to the respective current sources and to a respective sides of the resistively terminated lines and their collectors coupled to respective said emitter follower transistors of said multiplexor.

8. The open circuit detector system of claim 7 wherein:

said current switch transistors and said emitter follower transistors, in said multiplexor, have emitter, base and collector terminals;

each current switch transistor in said multiplexor has its base coupled to a respective one side of said resistively terminated line and its collector coupled to the emitter of a respective emitter follower transistor;

each emitter follower transistor having its base coupled to a respective one of said output stage output lines for comparing the voltage of said output stage output transistors to determine if one or both of said resistively terminated lines are open.

* * * * *